United States Patent [19]

Barnett et al.

[11] Patent Number: 4,818,337

[45] Date of Patent: Apr. 4, 1989

[54] THIN ACTIVE-LAYER SOLAR CELL WITH MULTIPLE INTERNAL REFLECTIONS

[75] Inventors: Allen M. Barnett, Newark; Michael G. Mauk, Wilmington, both of Del.

[73] Assignee: University of Delaware, Newark, Del.

[21] Appl. No.: 851,036

[22] Filed: Apr. 11, 1986

[51] Int. Cl.[4] .................. H01L 21/306; H01L 31/00; B44C 1/22

[52] U.S. Cl. .................. 156/659.1; 136/256; 136/261; 156/644; 156/653; 156/657; 156/662; 357/30; 437/2; 437/92

[58] Field of Search ............. 29/572, 576 W; 148/1.5, 148/175, 187; 156/644, 648, 653, 657, 659.1, 662, 603, 605, 610, 612, 613, 614; 136/244, 251, 252, 261, 256, 259; 357/29, 30; 427/85, 86; 437/2-5, 89-92

[56] References Cited

U.S. PATENT DOCUMENTS

| | | | |
|---|---|---|---|
| 3,306,768 | 2/1967 | Peterson | 117/106 |
| 3,487,223 | 12/1969 | St. John | 250/216 |
| 3,565,702 | 2/1971 | Nelson | 148/172 |
| 3,808,027 | 4/1974 | Anderson et al. | 117/47 A |
| 3,973,994 | 8/1976 | Redfield | 136/89 |
| 3,988,167 | 10/1976 | Kressel et al. | 136/89 |
| 4,086,102 | 4/1978 | King | 29/572 X |
| 4,152,824 | 5/1979 | Gonsiorawski | 29/572 |
| 4,156,309 | 5/1979 | Routh et al. | 29/572 |
| 4,162,928 | 7/1979 | Shepard, Jr. | 136/89 PC |
| 4,251,286 | 2/1981 | Barnett | 136/260 |
| 4,493,942 | 1/1985 | Sheng et al. | 136/259 |
| 4,507,158 | 3/1985 | Kamins et al. | 148/175 |
| 4,571,448 | 2/1986 | Barnett | 136/259 |
| 4,589,191 | 5/1986 | Green et al. | 437/2 |
| 4,638,110 | 1/1987 | Erbert | 136/246 |

Primary Examiner—William A. Powell
Attorney, Agent, or Firm—Connolly & Hutz

[57] ABSTRACT

High efficiency, thin active-layer silicon solar cells and a process for their fabrications have been provided. The cells are characterized by a capability of employing a low-cost, metallurgical grade silicon for the substrate. The substrate has a silicon dioxide barrier coating with electrical conductivity to the active semiconductor layers provided by a multiplicity of fine holes through the oxide. The holes have silicon therein to afford electrical continuity between the active layers and the silicon of the substrate. The process comprises in situ formation of silicon dioxide on the silicon, formation of the holes in the oxide by photolithography, and etching enabling nucleation and growth of silicon in the holes by epitaxy.

21 Claims, 2 Drawing Sheets (111) Substrate (110) and (100) Substrate

THIN ACTIVE-LAYER SOLAR CELL WITH MULTIPLE INTERNAL REFLECTIONS

FIELD OF THE INVENTION

This invention relates to photovoltaic semiconductor solar cells of thin film construction in which multiple internal reflections contribute to high efficiency. A novel structure having a reflective, textured surface of high optical efficiency and low electrical losses due to recombination is provided along with a process for its fabrication. The process includes selective nucleation at vias (openings) etched in an oxide coating on the surface of a silicon substrate. This nucleation leads to an overgrowth of a continuous layer of silicon filling openings or vias in the oxide layer and covering the oxide layer.

BACKGROUND

The photovoltaic effect, the capacity of some materials to absorb light and convert it to electricity, was known for more than a century before its potential as a practical source of energy was recognized. The importance of solar cells in space vehicles in recent years provided impetus to a flurry of investigations of various materials adaptable to the solar cells and to a variety of structures using these materials. From the standpoint of cost which, of course, includes both the cost of materials and efficiency of the solar cell to convert light into electricity, thin-film solar cells have become most attractive.

With an increasing number of photoactive materials and a variety of structures and methods of fabrication facing the designer of solar cells, the selection of the best combination becomes quite complex. Many factors infuencing efficiency are known and have been categorized by Barnett and Rothwarf in a paper "Thin-Film Solar Cells: A Unified Analysis of their Potential", in *IEEE Transactions on Electron Devices*, ED-27, No. 4, Apr. 1980, pages 615 to 630. In that paper, which describes a generic photovoltaic solar cell to which the present invention applies, major factors contributing to losses are discussed. Principal among those factors are optical losses, resulting in inefficiency in creation of carriers, and electrical losses, resulting from recombination of carriers in the semiconductor material and those occurring at interfaces of elements of the solar cell. It is to these losses that the present invention is primarily addressed.

Should actual solar cells be made in accordance with optimum materials and structures based on theoretical values, devices with efficiencies as great as 26 percent would result, substantially more efficient than the best of current production devices. That such high efficiencies are not routinely attainable, however, is partly a result of loss factors which are to a significant extent competitive: The longer the pathway of light through a photovoltaically active material (the absorber-generator), the greater the conversion of photons to carriers, but the greater the distance the carrier must travel to the collector-converter or to an electrically conductive pathway connected to the utilization circuit, the greater the recombination of carriers and loss of current generation capability.

Accordingly, structures providing a compromise between these competitive factors have been devised. Such structures employ thin films to minimize the distance a light-generated carrier must move in the absorber-generator layer to the converter-collector and thence to a conductor to thereby reduce the amount of recombination, and in combination, reflective means are provided to cause a multiplicity of reflections and passes of light through the absorber, increasing the distance light passes through and increasing light absorption, therefore current generation while decreasing the probability of recombination of carriers. The sheer number and continued appearance of new approaches with many variations of devices relying on thin films in combination with multiple reflections is indicative of the persistance of unsolved problems in this field.

A general method of achieving multiple reflections is to provide textured surfaces which cause reflections at a variety of angles back through the active layers. In the patent literature, there are disclosures on texturing by sandblasting (U.S. Pat. No. 3,487,223, issued to A. E. St. John, Dec. 30, 1969), by grooving the back of a transparent substrate (U.S. Pat. No. 3,973,994, issued to David Redfield, Aug. 10, 1976) and a variation of grooving, formation of a two-dimensional diffraction grating etched by electron beams on a substrate wherein the patterned surface is coated with silver or other conductive material (U.S. Pat. No. 4,493,942, issued to Ping Sheng, et al., Jan. 15, 1985).

The use of blocking layers, as described by Barnett in U.S. Pat. No. 4,251,286, to avoid undesired electrical contacts due to discontinuities in the active elements of solar cells and to prevent unwanted migration of contaminants into the photovoltaically active elements, inherently increased flexibility of design of solar cells. The provision of controlled electrical conductivity through insulating blocking layers is described in U.S. Pat. No. 3,988,167, issued to H. Kressler, et al., which discloses a solar cell having a semiconductor as a photovoltaically active element in which one surface has a non-continuous oxide layer thereon. The layer is non-continuous by virtue of openings through the layer arranged in a precise, preselected pattern to coincide with grid electrodes. The complexity of the fabrication procedure disclosed, involving formation of the oxide coating on what could be fragile silicon wafers, creation of the openings in a precise pattern by photolithography, vacuum deposition of conductive material (gold or chromium) in the openings, and removal of excess conductive material between openings by a second photolithographic step, however, appears hardly conducive to development of low-cost, rugged by efficient solar cells.

U.S. Pat. No. 4,571,448, issued Feb. 18, 1986, to Allen M. Barnett, incorporated herein by reference, discloses the use of barrier layers, in particular, the function of such as quarter wave reflectors to increase the efficiency of solar cells (col. 5, lines 40 to 59). Also disclosed therein is the use of liquid phase epitaxy in fabrication of solar celsolar cells.

While

While inventions in these disclosures and many others may have resulted in improvements within the scope of their objectives, there remain many specific areas where there is a need for additional improvements. Among these is a need for improvements in solar cell structures and a process for making it which can utilize relatively low cost materials which provide multiple reflections while minimizing internal and boundary recombinations. In this regard, silicon is an effective photovoltaic material in the very pure state with appropriate doping, but it has a low absorption and conversion of light to charge carriers, especially in the longer wavelength portion of the solar spectrum, so that long pathways in this material are required. Widespread use of silicon thin films in solar cells provided with means for internal reflection, however, has been inhibited to some extent by the difficulty finding economically attractive, reflective surfaces on barriers or substrates for silicon active-layer deposition in which surface and/or boundary recombination is sufficiently low so as to not offset any advantage in low recombination rates in the bulk of the thin film structure.

OBJECTIVES

In accordance with the foregoing, it is an objective of the present invention to provide multiply reflecting, thin active layer solar cell structures and a process for their fabrication which is adaptable to formation on a low-cost substrate, with a surface passivating layer having conductive pathways at the interface of the substrate and the adjacent photovoltaically active layer to provide a multiplicity of reflections back into the active layers of the cell while also having a low rate of carrier recombination at the interface.

It is a further object of the present invention to provide a solar cell with means for multiple internal reflections wherein the substrate material is metallurgical grade silicon.

It is still a further object of the present invention to provide a solar cell with a metallurgical grade silicon substrate which is adaptable to deposition of a silicon photovoltaically active layer thereon by liquid phase epitaxy.

These and other objectives will be understood from the description of the invention and the accompanying drawing.

SUMMARY OF THE INVENTION

The objectives of the invention are accomplished by using a silicon substrate which may be semiconductor grade or a lower quality, metallurgical grade, forming a layer of silicon dioxide on its surface, formation of a plurality of discrete openings on the oxidized surface layer by photolithographic techniques to expose areas of the silicon of the substrate coextensive with the openings in the silicon dioxide. A preferred process comprehends anisotropic etching of the substrate before oxidation of the surface of the substrate. Further, the invention comprehends overgrowth of the oxide layer with silicon and deposition of doped silicon active layers by liquid phase epitaxy.

DESCRIPTION OF THE INVENTION

Figure 1:
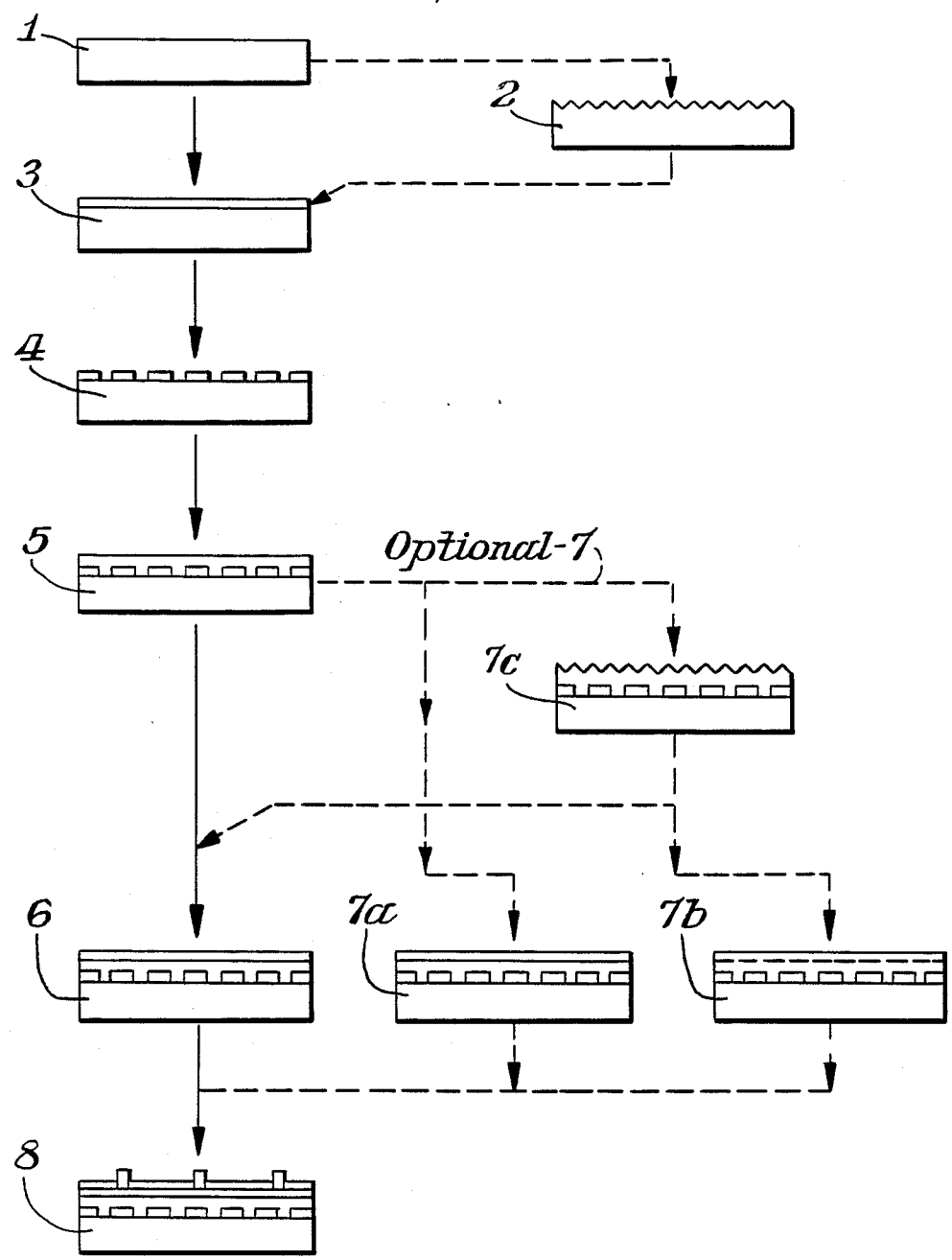
FIG. 1 is a block diagram of the steps of a process for fabrication of a solar cell in accordance with the present invention.

A broad overall objective of the present invention is to provide an efficient thin active-layer solar cell employing a low-cost grade of silicon (e.g., metallurgical grade) as a substrate. Silicon/silicon interfaces, due to the closeness of refractive index, would not (in accordance with Fresnel's law of classical physical optics) provide good reflectivity of obliquely incident light. A silicon dioxide interface would provide the desired change in refractive index.

In keeping with the broad objective, the present invention has provided a rugged, efficient solar cell structure made by a process comprising several simple steps. These steps include in situ thermal formation of silicon dioxide on a surface of a silicon substrate (which may be a metallurgical grade silicon in the interest of lowering the cost, although semiconductor grade silicon is workable), the formation of holes or vias in the silicon dioxide by photolithography which exposes a multiplicity of minute areas of the silicon surface of the substrate in the holes formed in the silicon dioxide coating. For convenience, the silicon body of the substrate should have at least one substantially uniform or planar surface upon which to fabricate the elements of the solar cell.

In accordance with the invention, a highly doped p-type, photovoltaically inactive silicon thin body (0.001 ohm-cm.) is used as the body of a substrate of a solar cell. A very thin layer of silicon dioxide to form an approximately quarter-wave reflector for weakly absorbed photons with energies near the band gap of silicon (the active layer absorber) is formed on the silicon to be between it and the adjacent active layer. Following its formation on the substrate, holes through the oxide layer are provided by photolithographic and etching techniques. Growth of the p-type layer is initiated by selective nucleation at the vias and a continuous silicon layer is formed by subsequent overgrowth of the oxide. An n-type layer may then grow over the p-type layer to form an electrical junction. The thickness of the p-type absorber layer can range from 5 to 50 micrometers, as desired. A shallow epitaxial junction is formed between the absorber and the thin (0.1 to 0.5 micrometer) n-type collector layer. The oxide layer provides the essential change in refractive index for optimum reflection of light at the back surface of the absorber (the refractive index, n, of silicon is 3.5, that of silicon dioxide is 1.5). The holes in the oxide (sometimes called *vias*) exposing silicon of the substrate provide electrical contact between the substrate and the absorber. The exact configuration of the holes is not critical, but for convenience they are, as determined by the mask in a rectangular or hexagonal pattern in accordance with the morphology of the silicon, about 50–200 micrometers apart, with a diameter of 5–20 micrometers. The area of the holes, however, makes up only about 5% of the total inerfacial area between the absorber and the substrate. The substrate is not a photovoltaically active part of the cell (serving only mechanical support and electrical conductivity functions), so it can be of metallurgical rather than semiconductor quality. The oxide film also serves as a metallurgical barrier preventing migration of impurities from the substrate into and contaminating the active layers.

The invention can be understood by reference to FIG. 1, which illustrates in block form successive process steps, as indicated by the numerals in the respective blocks.

The body of the substrate, as in step 1, is selected or formed from single crystal, electrically conductive silicon, which need not be semiconductor grade, as in the photovoltaically active elements, but it may be of metallurgical grade. This substrate body should have at least one substantially planar surface or of a wafer-like configuration for deposition of the photovoltaic layers thereon. Optionally, the planar surface of the substrate may be etched with solution of sodium hydroxide or potassium hydroxide in a lower aliphatic alcohol, as is known to the art, as in step 2, for additional texturing. The substrate is then thermally oxidized, step 3, by heating to 1000° C. in wet oxygen, to provide a silicon dioxide coating to reduce migration of impurities into and avoid contaminating the active layers and also to provide a change in refractive index to enhance reflectivity from the substrate. The thickness of the oxide film, of the order of 1500 Angstroms, may be optimized so as to form a quarter-wavelength reflector for the weakly absorbed components of solar radiation with energies near the band gap.

Continuing in reference to FIG. 1, the oxide is provided with a multiplicity of holes or "vias" as they are called by Leamy and Doherty in *Applied Physics Letters*, 37 11, Dec. 1, 1980 pp. 1028–1030. These vias are formed by photolithographic techniques, as is known to the art, as in step 4 in which ultraviolet radiation impinging through small openings in a mask converts corresponding areas of a photoresist coated on the silica so that it can be dissolved leaving openings to the oxide coating. The oxide in the areas exposed by the openings is then removed by dissolution with an acide fluoride reagent (49% HF) to provide corresponding openings through the oxide to the silicon substrate. After solvent washing to remove the photoresist, the substrate with the discontinuous coating is ready for deposition of silicon in the vias and overlying the free area of the oxide coating.

An important step in the process is step 5, deposition and overgrowth of silicon in the openings or vias which is done by liquid phase epitaxy (LPE) which involves contact of the surface and vias with a saturated solution of silicon in molten metal, such as tin, or lead, indium or some alloy (see U.S. Pat. No. 3,565,702 issued Feb. 23, 1971 to Nelson). The exposed silicon at the bottom of the vias serves as sites for nucleation to seed growth of silicon. Layer thickness of silicon is controlled by the cooling rate and the growth time in LPE.

Preferably, overgrowth of epitaxially deposited silicon as in step 5, extending through the vias and over the silicon layer, is doped (e.g., for p-type or n-type conductivity) to provide a photovoltaically active layer. This step may be followed by step 6, a second liquid phase epitaxial growth step containing silicon with a dopant to provide a layer of the opposite conductivity type and a p-n junction. The solar cell may be completed, as in step 8, by application of electrical contacts on the front and back of the cell, i.e., a transparent grid conductor on the light-incident side and a stable metal layer (as by vacuum deposition) on the back of the substrate. Antireflection (AR) coatings and protective layers may be added at this stage for a complete, serviceable solar cell.

Optionally, as shown in FIG. 1, following step 5 alternative path 7 may be followed. This path has two choices, the first in which the overgrowth layer is employed to produce a metal insulator semiconductor (MIS) junction directly thereon, step 7a, or in step 7b through diffusion technology wherein the second dopant is diffused directly into the overgrowth, or a second junction is formed by chemical vapor deposition of a layer of opposite conductivity type the overgrowth layer. The second choice, step 7c, which may be employed, includes etching the surface of the overgrown layer to form a textured surface before 7b is employed to provided the junction.

Other variations, including some not illustrated in FIG. 1 may be employed at the discretion of the skilled artisan.

The LPE method is also used for overgrowth of silicon over the silicon dioxide layer and for formation of the appropriately doped semiconductor layers to form a junction, step 6, because the substrate seed is single crystal and the growth is epitaxial, the silicon in the vias and the overgrown layer is also single crystal with the same crystal orientation as the substrate, thus avoiding recombination losses associated with grain boundaries. If the substrate has a (100) or (110) orientation, crystals nucleated at the via holes are pyramidal. The result is a continuous layer with a textured surface. If the substrate has a (111) orientation, the crystallites are polyhedrons with triangular bases. The via holes preferably should have a minimum size of approximately 5 microns across for wetting by silicon from the liquid phase solvent. The spacing of the vias preferably should be from 50 to 200 micrometers for overgrowth covering provide optimum electrical conductivity. It is significant that the overgrowth can provide a continuous layer, which with appropriate doping, forms an element of the active photovoltaic layers.

Figure 2:
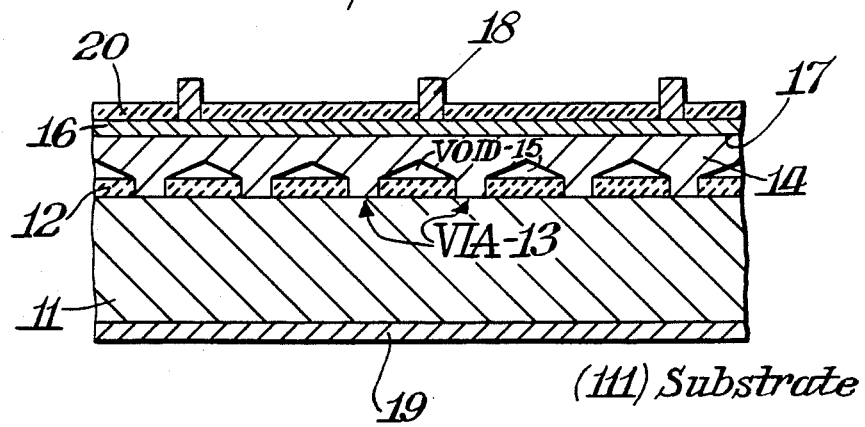
FIG. 2 is a cross sectional illustration of a solar cell accordance with the present invention with a silicon substrate having a (111) crystal orientation.

FIG. 2 illustrates an embodiment of a photovoltaic solar cell in accordance with the invention. The cell consists of substrate 11, of a photovoltaically inactive material, about 0.2–0.5 mm in thickness of metallurgical grade silicon, which is covered with silicon dioxide layer 12 of a thickness on the order of about a quarter wavelength 0.15 to 0.20 micrometers. Oxide layer 12 is interspersed with silicon dioxide-free holes or vias 13 e.g., areas from which the silicon dioxide layer has been removed to form vias which penetrate the silica to the substrate. Silicon semiconductor 14 fills vias 13 and overlies silicon dioxide layer to form a continuous layer of semiconductor 1 of about 25 microns thickness having small voids adjacent oxide 12. Second layer 16, a semiconductor of opposite conductivity type (p-type or n-type) with respect to semiconductor layer 14 forms a p-n junction 17. In the illustrated embodiment, a silicon homojunction solar cell, semiconductor grade silicon, deposited by liquid phase epitaxy, was doped with gallium (or some other Group III element could be used) to provide p-type conductivity.

Second photovoltaic layer 16 also of silicon (semiconductor grade), of a thickness of about 0.25 micrometer, but doped with antimony (or some other Group V element) to be of an opposite conductivity, n-type, was deposited over the first by a similar liquid phase epitaxial technique. It is to be understood, however, that respective conductivity types could be reversed, also that different dopants may be employed. Further, other semiconductors may be used in which dopants are selected in type and adjusted in content in the silicon to provide sufficient electrical conductivity to the multiple-reflecting substrate with low recombinations at the boundary. Further, on the first semiconductor, a metal film could be used for a Shottky barrier or MIS junction solar cell.

Electrical connections of the solar cell to an external utilization circuit are made through metal grid 18 which forms a transparent electrode and through contact 19 at the base of substrate 11. The entire cell, with its sturdy, relatively low cost silicon substrate, its semiconductor/silicia interface provides a low recombination rate and high reflectivity for an efficient, durable unit.

Figure 3:
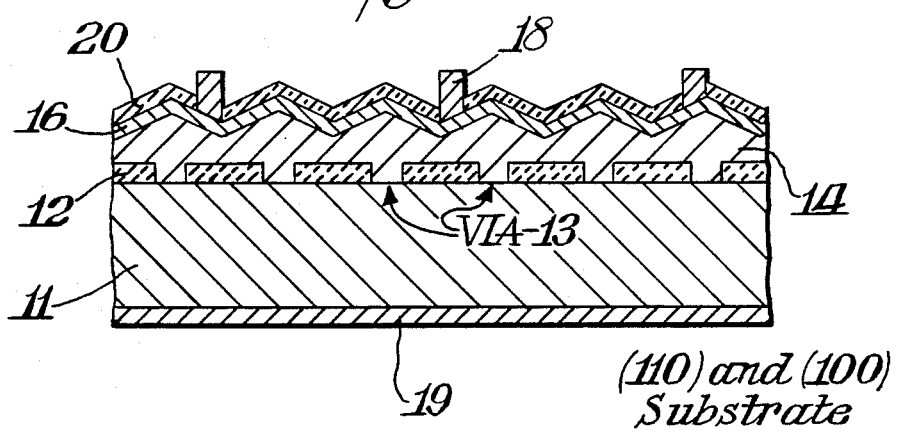
FIG. 3 is a cross-sectional illustration, not to scale, of a solar cell in accordance with the present invention with a silicon substrate having a (100) or a (110) crystal orientation.

FIG. 3 illustrates a solar cell in accordance with the present invention in which the silicon substrate has a (100) or a (110) crystal orientation. The numerals referring to elements correspond to those in FIG. 2. It should be observed that the overgrowth of silicon does not leave voids adjacent the silicon dioxide in FIG. 2, but forms substantially a continuum of silicon grown from the silicon substrate of (100) and (110) crystal orientation.

Figure 4:
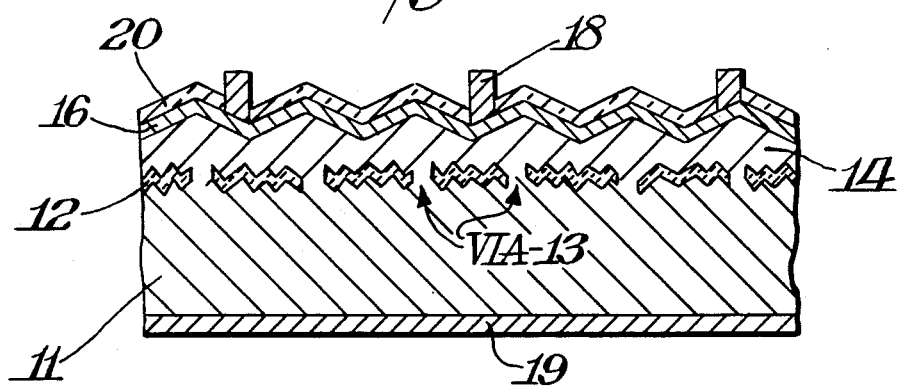
FIG. 4 is a cross-sectional illustration, not to scale, of a solar cell in accordance with the present invention with a silicon substrate with its surface etched before formation of an oxide layer thereon.

FIG. 4 illustrates a solar cell in accordance with the present invention, herein numbers identify like parts as in FIG. 2 and FIG. 3, in which the silicon substrate is etched with alcoholic caustic (e.g., potassium or sodium hydroxide in a lower alkyl alcohol such as propanol). The holes in the oxide layer are formed as in the preceding by the photolithographic technique involving etching of selected portions to provide vias. Similar growth was employed to deposit the silicon to a finely textured interface for multiple reflections.

While the preferred method disclosed herein for forming the oxide layer on the surface of the substrate comprises thermal oxidation, an acceptable oxide layer can also be formed by anodization or hydrolysis of silicon tetrachloride, the latter by the method taught by Peterson in U.S. Pat. No. 3,306,768, incorporated by references herein, or by an adaption of the hydrolysis method of Anderson, et al., U.S. Pat. No. 3,808,027. Other methods of forming the silica film are also workable and include "spin-on", sputtering, or vapor deposition. Other dielectric film such as silicon nitride ($Si_3N_4$) could be used in place of $SiO_2$. It should be observed, however, that great care must be employed to avoid contaminants in these methods which could adversely affect the photovoltaic properties of the semiconductor layer with which it will be in contact.

Further, it should be noted that a textured surface is formed on the silicon by etching and that this is replicated on the thermally formed oxide surface. Similarly, liquid phase epitaxially deposited silicon has a textured surface, enhancing multiple reflections.

We claim:

1. In a process for forming a silicon photovoltaic solar cell having a silicon substrate, at least one surface of the substrate having thereon a coating of a barrier layer and a multiplicity of electrical pathways through the coating to electrically couple photovoltaically active elements of the solar cell with the silicon substrate, the process comprising:

providing an electrically conductive silicon body having at least one substantially uniform surface;

formation of a thin coating on the substantially uniform surface to form the barrier layer;

formation by lithography and etching of a multiplicity of holes extending through the coating to expose microscopic areas of silicon of the substrate with the exposed areas comprising a minor proportion of the substrate; and epitaxially growing of silicon in the holes to provide electrical pathways through the coating.

2. A process for forming a silicon photovoltaic solar cell with a silicon substrate, at least one surface of the substrate having a coating of silicon dioxide thereon forming a barrier layer, and a multiplicity of electrical pathways extending through the coating to electrically couple photovoltaically active elements of the solar cell with the silicon substrate, the process comprising:

providing an electrically conductive silicon body having at least one substantially uniform surface;

formation of a thin oxide coating on the substantially uniform surface;

formation by photolithography and etching of a multiplicity of holes extending through the oxide coating to expose microscopic areas of the silicon of the substrate;

epitaxially growing silicon in the holes through the oxide coating to provide electrical pathways extending through the oxide coating between photovoltaically active elements of the cell and the silicon substrate;

growing a first photoactive silicon layer of a preselected conductivity type in electrical contact with the conductive pathways in the holes through the oxide coating;

forming a second photoactive layer to provide a junction of an opposite conductivity type on the first layer; and application of electrical contacts to the substrate and the side upon which solar radiation is incident.

3. The process of claim 2 wherein the silicon body is provided from metallurgical grade silicon.

4. The process of claim 2 wherein the oxide coating is formed in situ by thermal oxidation of the substantially planar surface of the silicon body.

5. The process of claim 2 wherein the growth of silicon in the holes extending through the oxide coating is by means of liquid phase epitaxy.

6. The process of claim 2 wherein the silicon grown in the holes in the oxide coating contains a dopant to provide photoactivity and form the first photoactive layer.

7. The process of claim 2 wherein the semiconductors are grown by liquid phase epitaxy.

8. In a silicon photovoltaic solar cell for conversion of solar radiation to electrical energy, wherein the solar cell includes a photovoltaically inactive silicon substrate functioning as a mechanical support and as an electrical contact with at least one photovoltaically active layer of silicon formed thereon, the improvement being;

a barrier layer formed by a coating of a dielectric material interposed between the substrate and active layers; and a multiplicity of microscopic openings extending through the coating of dielectric material and exposig a minor proportion of the area of the substrate wherein the barrier layer comprises a means for enhancing reflectivly from the substrate and for preventing migration of impurities from the substrate and wherein the openings further comprise conductive pathways.

9. The solar cell of claim 8 wherein the openings through the coating are made electrically conductive by means of silicon grown therein and extending through the coating.

10. The of claim 9 wherein the silicon grown in the openings in the coating extends beyond the holes and substantially overgrown the coating between the openings.

11. A silicon solar cell adapted to provide multiple internal reflections from a textured interface, said cell comprising:

a silicon substrate;

a passivating silicon dioxide coating of substantially a quarter wave thickness on the substrate;

a multiplicity of holes in the coating extending through the coating and exposing a minor proportion of the substrate;

silicon in the holes to provide a conductive pathway through the silicon dioxide coating to the silicon substrate;

a first photovoltaically active silicon semiconductor layer in contact with the silicon in the holes;

a second photovoltaically active semiconductor layer of the opposite conductivity type with respect to the first overlying the first layer and forming a junction; and electrical contacts of a utilization circuit on the substrate and the light-incident side.

12. The solar cell of claim 8 wherein openings through the coating are at least 5 micrometers across.

13. The solar cell of claim 8 wherein the openings are spaced from 50 to 200 micrometers apart.

14. The solar cell of claim 8 wherein the barrier layer is a coating of silicon dioxide.

15. The solar cell of claim 8 wherein the barrier layer is a coating of silicon nitride.

16. The solar cell of claim 8 wherein the silicon body is provided from metallurgical grade silicon.

17. The solar cell of claim 9 wherein the coating is silicon dixoide of substantially a quarter wave thickness.

18. The solar cell of claim 8 wherein the coating is a silicon oxide film which functions to alter the refractive index to optimize light reflection.

19. The solar cell of claim 8 wherein the exposed silicon at the bottom of said openings comprises nucleation sites to seed growth of silicon.

20. The solar cell of claim 8 wherein said barrier layer comprises a surface passivating layer.

21. The solar cell of claim 8 wherein the area of said openings comprises about 5% of the total interfacial area between said substrate and the absorber of said cell.

* * * * *